US012704560B2

(12) United States Patent
Eswaran et al.

(10) Patent No.: US 12,704,560 B2

(45) Date of Patent: Aug. 11, 2026

(54) SYSTEMS AND METHODS FOR IMPROVING DEVICE LOCATABILITY

(71) Applicant: ZEBRA TECHNOLOGIES CORPORATION, Lincolnshire, IL (US)

(72) Inventors: Pavithra Eswaran, Plainview, NY (US); Gbenga Olowoyeye, Bay Shore, NY (US); Hasith Balasooriya, Piliyandala (LK); Mariya Wright, Cortland Manor, NY (US); Christopher P. Klicpera, Westbury, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 551 days.

(21) Appl. No.: 18/141,168

(22) Filed: Apr. 28, 2023

(65) Prior Publication Data

US 2024/0361398 A1 Oct. 31, 2024

(51) Int. Cl.

| | |
|---|---|
| ***G01R 31/396*** | (2019.01) |
| ***G01R 31/3842*** | (2019.01) |
| ***G01R 31/392*** | (2019.01) |
| ***H04W 4/80*** | (2018.01) |

(52) U.S. Cl.

CPC ....... *G01R 31/396* (2019.01); *G01R 31/3842* (2019.01); *G01R 31/392* (2019.01); *H04W 4/80* (2018.02)

(58) Field of Classification Search

CPC .............. G01R 31/396; G01R 31/3842; G01R 31/392; H04W 4/80

See application file for complete search history.

(56) References Cited

U.S. PATENT DOCUMENTS

| | | | | |
|---|---|---|---|---|
| 2009/0280826 A1* | 11/2009 | Malik | H04W 52/0261 455/456.1 |
| 2014/0011469 A1* | 1/2014 | Fenn | H04W 4/90 455/404.1 |
| 2019/0037341 A1 | 1/2019 | Polska | |
| 2020/0341107 A1 | 10/2020 | Czarnecky et al. | |
| 2021/0296907 A1 | 9/2021 | Bourilkov et al. | |

FOREIGN PATENT DOCUMENTS

WO WO-2016130216 A1 * 8/2016 ........ H04W 52/0206

OTHER PUBLICATIONS

WO-2016130216-A1_translated (Year: 2016).*

International Patent Application for International Patent No. PCT/US2024/26077 mailed on Jul. 30, 2024.

* cited by examiner

*Primary Examiner* — Catherine T. Rastovski

*Assistant Examiner* — Michael J Singletary

(57) ABSTRACT

Systems and methods for improving device locatability are disclosed herein. An example method includes determining a beacon mode capacity of a device battery, the beacon mode capacity corresponding to a device operating in a beacon mode while powered by the device battery. The example method further includes calculating a total battery power of the device battery and an aged total battery power of the device battery based on the total battery power and a state of health (SOH) of the device battery. The example method further includes determining a beacon state of charge (SOC) threshold for the device battery based on the beacon mode capacity and the aged total battery power, and causing the device to begin operating in the beacon mode when a remaining charge of the device battery is less than the beacon SOC threshold.

22 Claims, 5 Drawing Sheets

SYSTEMS AND METHODS FOR IMPROVING DEVICE LOCATABILITY

BACKGROUND

Modern scanning devices bring convenience, flexibility, and maneuverability to data capture workflows. However, handheld scanning devices are frequently misplaced in warehouses, retail stores, hospitals, and other settings. Conventional techniques for locating such scanning devices in the event of misplacement have various limitations, such that there is a need for systems and methods to quickly, efficiently, and accurately locate scanning devices and thereby reduce/eliminate the impact of these limitations.

SUMMARY

In an embodiment, the present invention is a method for improving device locatability. The method may comprise: determining a beacon mode capacity of a device battery, the beacon mode capacity corresponding to a device operating in a beacon mode while powered by the device battery; calculating a total battery power of the device battery; calculating an aged total battery power of the device battery based on the total battery power and a state of health (SOH) of the device battery; determining a beacon state of charge (SOC) threshold for the device battery based on the beacon mode capacity and the aged total battery power; and causing the device to begin operating in the beacon mode when a remaining charge of the device battery is less than the beacon SOC threshold.

In a variation of this embodiment, the beacon mode capacity of the device battery is determined based on a user-defined beacon mode duration, during which, the device battery is configured to power the device to operate in the beacon mode. Further in these variations, the computer-implemented method may further include: determining a battery voltage and a battery current of the device battery when the device operates in the beacon mode; calculating, based on the battery voltage and the battery current, an average power consumption of the device battery when the device operates in the beacon mode; and determining the beacon mode capacity of the device battery based on the average power consumption and the user-defined beacon mode duration.

In another variation of this embodiment, the computer-implemented method further includes: determining a full charge capacity (FCC) of the device battery based on the aged total battery power; and determining the beacon SOC threshold based on the beacon mode capacity and the FCC. Further in this variation, the device battery is a smart battery, and the FCC is determined based on a gas gauge integrated circuit (IC) of the smart battery.

In yet another variation of this embodiment, the device is an imaging device including an illumination component and an imaging assembly, and wherein causing the device to begin operating in the beacon mode further includes: disabling the illumination component and the imaging assembly; and periodically emitting a beacon signal. Further in this variation, the beacon signal includes one or more of: (i) an advertising packet in Bluetooth Low Energy (BLE) beaconing, (ii) an advertising packet in Bluetooth Classic beaconing, (iii) an advertising packet in Wi-Fi beaconing, (iv) a flash from an illumination device, (v) an audible tone, or (vi) a radio frequency identification (RFID) signal.

In still another variation of this embodiment, the device is configured to pair with a host device when the device is within a pairing range of the host device, and the method further includes: determining that the device has exceeded the pairing range of the host device; and causing the device to begin operating in the beacon mode when the remaining charge of the device battery reaches the beacon SOC threshold and while the device continues to exceed the pairing range of the host device. Further in this variation, the beacon SOC threshold is a first beacon SOC threshold, and the method further includes: determining that the device is within the pairing range of the host device; and causing the device to begin operating in the beacon mode when the remaining charge of the device battery reaches a second beacon SOC threshold and while the device remains within the pairing range of the host device, wherein the second beacon SOC threshold is less than the first beacon SOC threshold.

In yet another variation of this embodiment, the computer-implemented method further includes: determining a battery critical threshold, beyond which, the device is deactivated to prevent a total battery discharge; and deactivating the device when the remaining charge of the device battery is less than the battery critical threshold.

In still another variation of this embodiment, the total battery power of the device battery represents the device battery having a maximum battery capacity at a nominal battery voltage and a maximum SOH.

In another embodiment, the present invention is a computer-implemented method for improving device locatability. The method includes: determining, based on a user-defined beacon mode duration, a beacon mode capacity of a device battery, the beacon mode capacity corresponding to a device operating in a beacon mode while powered by the device battery; calculating a total battery power of the device battery; determining a beacon state of charge (SOC) threshold for the device battery based on the beacon mode capacity and the total battery power; and causing the device to begin operating in the beacon mode when a remaining charge of the device battery is less than the beacon SOC threshold.

In a variation of this embodiment, the computer-implemented method further includes: calculating an aged total battery power of the device battery based on the total battery power and a state of health (SOH) of the device battery; and determining the beacon SOC threshold for the device battery based on the beacon mode capacity and the aged total battery power.

In another variation of this embodiment, the computer-implemented method further includes: determining a battery voltage and a battery current of the device battery when the device operates in the beacon mode; calculating, based on the battery voltage and the battery current, an average power consumption of the device battery when the device operates in the beacon mode; and determining the beacon mode capacity of the device battery based on the average power consumption and the user-defined beacon mode duration.

In yet another variation of this embodiment, the computer-implemented method further includes: determining a full charge capacity (FCC) of the device battery based on the aged total battery power; and determining the beacon SOC threshold based on the beacon mode capacity and the FCC. Further in this variation, the device battery is a smart battery, and the FCC is determined based on a gas gauge integrated circuit (IC) of the smart battery.

In still another variation of this embodiment, wherein the device is an imaging device including an illumination component and an imaging assembly, and wherein causing the device to begin operating in the beacon mode further includes: disabling the illumination component and the imaging assembly; and periodically emitting a beacon signal.

In yet another variation of this embodiment, the device is configured to pair with a host device when the device is within a pairing range of the host device, and the method further includes: determining that the device has exceeded the pairing range of the host device; and causing the device to begin operating in the beacon mode when the remaining charge of the device battery reaches the beacon SOC threshold and while the device continues to exceed the pairing range of the host device.

In still another variation of this embodiment, the computer-implemented method further includes: determining a battery critical threshold, beyond which, the device is deactivated to prevent a total battery discharge; and deactivating the device when the remaining charge of the device battery is less than the battery critical threshold.

In yet another embodiment, the present invention is a tangible machine-readable medium comprising instructions for improving device locatability that, when executed, cause a machine to at least: determine a beacon mode capacity of a device battery, the beacon mode capacity corresponding to a device operating in a beacon mode while powered by the device battery; calculate a total battery power of the device battery; calculate an aged total battery power of the device battery based on the total battery power and a state of health (SOH) of the device battery; determine a beacon state of charge (SOC) threshold for the device battery based on the beacon mode capacity and the aged total battery power; and cause the device to begin operating in the beacon mode when a remaining charge of the device battery is less than the beacon SOC threshold.

In still another embodiment, the present invention is a device for improving device locatability. The device includes: one or more processors; and a memory configured to store instructions thereon, that when executed by the one or more processors, cause the one or more processors to: determine a beacon mode capacity of a device battery, the beacon mode capacity corresponding to the device operating in a beacon mode while powered by the device battery, calculate a total battery power of the device battery, calculate an aged total battery power of the device battery based on the total battery power and a state of health (SOH) of the device battery, determine a beacon state of charge (SOC) threshold for the device battery based on the beacon mode capacity and the aged total battery power, and cause the device to begin operating in the beacon mode when a remaining charge of the device battery is less than the beacon SOC threshold.

In yet another embodiment the present invention is a device for improving device locatability. The device includes: one or more processors; and a memory configured to store instructions thereon, that when executed by the one or more processors, cause the one or more processors to: determine, based on a user-defined beacon mode duration, a beacon mode capacity of a device battery, the beacon mode capacity corresponding to the device operating in a beacon mode while powered by the device battery, calculate a total battery power of the device battery, determine a beacon state of charge (SOC) threshold for the device battery based on the beacon mode capacity and the total battery power, and cause the device to begin operating in the beacon mode when a remaining charge of the device battery is less than the beacon SOC threshold.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
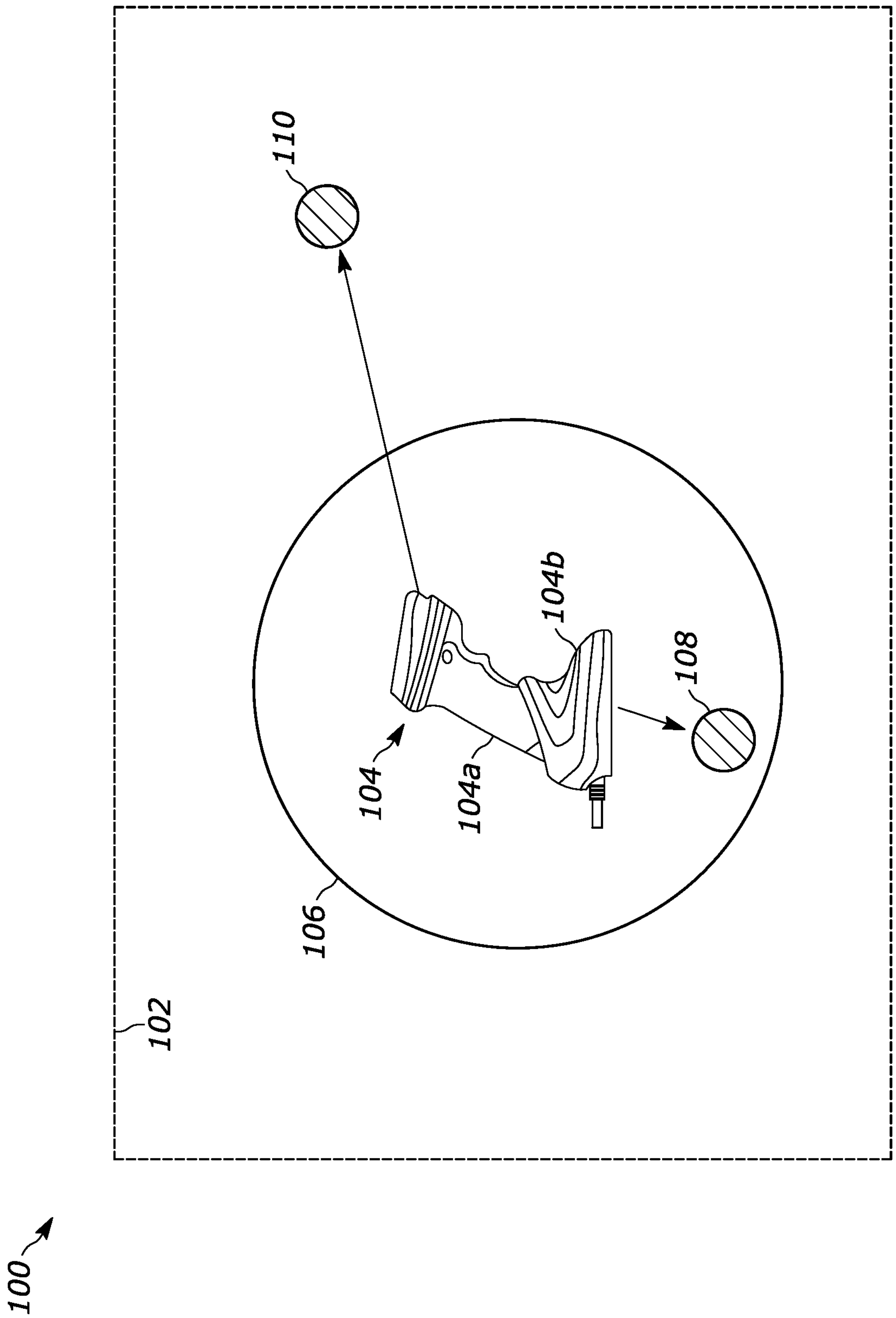
FIG. 1 is an example scanning device and cradle within a scanning environment where techniques for improving device locatability may be implemented, in accordance with embodiments described herein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

As previously mentioned, conventional techniques for locating handheld scanning devices suffer from several issues. For example, conventional techniques lack sufficient range to locate scanning devices when the devices are misplaced and/or otherwise located beyond a pairing range with the corresponding charging/docking cradle. In these circumstances, the scanning devices may emit various signals (e.g., audible beeping, visible light flashing) intended to attract the attention of nearby personnel. However, these signals can rapidly drain the scanning device battery, leaving the battery completely drained before the scanning device is located. As a result, conventional locating techniques can leave handheld, cordless, and/or otherwise portable scanning devices lost and powerless.

Thus, it is an objective of the present disclosure to eliminate these and other problems with such conventional techniques by providing systems and methods for improved device locatability. The systems and methods of the present disclosure may ensure that scanning devices more frugally allocate remaining battery life in the event of misplacement, such that each scanning device may be more reliably located. In this manner, the systems and methods of the present disclosure may provide more reliable and effective device locationing than conventional techniques, and may significantly increase successful device locationing and prolong overall device battery life due to minimal over-draining (e.g., complete battery drain) events relative to conventional techniques.

In accordance with the above, and with the disclosure herein, the present disclosure includes improvements in computer functionality or in improvements to other technologies at least because the present disclosure describes that, e.g., device locationing systems, and their related various components, may be improved or enhanced with the disclosed methods and systems that provide accurate, reliable, and efficient device locationing for respective users and administrators. That is, the present disclosure describes improvements in the functioning of a device locationing system itself or "any other technology or technical field" (e.g., the field of device locationing systems) because the disclosed methods and systems improve and enhance operation of device locationing systems by introducing improved scanning device tracking techniques, and device battery preservation techniques that reduce and/or eliminate many inefficiencies typically experienced over time by device locationing systems lacking such methods and systems. This improves the state of the art at least because such previous device locationing systems can be inefficient and inaccurate due to issues associated with limited tracking techniques and device battery expiration.

In addition, the present disclosure includes applying various features and functionality, as described herein, with, or by use of, a particular machine, e.g., a scanning device, a charging cradle, and/or other hardware components as described herein.

Moreover, the present disclosure includes specific features other than what is well-understood, routine, conventional activity in the field, or adding unconventional steps that demonstrate, in various embodiments, particular useful applications, e.g., determining a beacon mode capacity of a device battery, the beacon mode capacity corresponding to a device operating in a beacon mode while powered by the device battery; calculating a total battery power of the device battery; calculating an aged total battery power of the device battery based on the total battery power and a state of health (SOH) of the device battery; determining a beacon state of charge (SOC) threshold for the device battery based on the beacon mode capacity and the aged total battery power; and causing the device to begin operating in the beacon mode when a remaining charge of the device battery is less than the beacon SOC threshold.

Turning to the Figures, FIG. 1 is an example scanning environment 100 that includes a scanning device 104*a* and cradle 104*b*, where techniques for improving device locatability may be implemented, in accordance with embodiments described herein. The example scanning environment 100 may include a work environment 102, such as a warehouse, a retail store, a hospital, and/or any other suitable location where the scanning device 104*a* and the cradle 104*b* may be located. When the scanning device 104*a* is docked with the cradle 104*b*, the combination 104 may remain in an inactive state where the scanning device 104*a* receives power to charge the device battery from the cradle 104*b*. When the scanning device 104*a* is removed from the cradle 104*b*, the scanning device 104*a* may transition to an active state where, upon trigger pull, the scanning device 104*a* may capture image data of objects that may include indicia.

In certain embodiments, the scanning device 104*a* may be a wireless/cordless scanning device. For example, the scanning device 104*a* and the cradle 104*b* may have integrated transceivers (not shown) and/or other suitable device(s) that enable the device 104*a* and the cradle 104*b* to engage in two-way communications. These two-way communications may be or include the scanning device 104*a* pairing with the cradle 104*b*, so the cradle 104*b* may receive periodic updates regarding the status of the scanning device 104*a*. For example, while paired with the cradle 104*b* and within the pairing range 106, the scanning device 104*a* may transmit data corresponding to scanned indicia and/or remaining battery life of the scanning device 104*a* back to the cradle 104*b*. In this manner, the cradle 104*b* may record and/or otherwise receive status updates from the scanning device 104*a* indicating that the scanning device 104*a* is within the pairing range 106 of the cradle 104*b*.

Further, the scanning device 104*a* and the cradle 104*b* may have wireless signal transceivers configured to transmit and/or receive beacon signals, such as Bluetooth® low energy (BLE) beaconing. This beaconing may be or include the scanning device 104*a* broadcasting a BLE signal at regular/frequent intervals to allow the cradle 104*b* and/or other nearby devices to determine proximity to the scanning device 104*a*. Thus, while the scanning device 104*a* is decoupled from the cradle 104*b*, the scanning device 104*a* may periodically transmit a beacon signal that is received by the cradle 104*b* to provide relative location information about the scanning device 104*a*. In particular, the BLE signal may be structured and/or adhere to any suitable protocol (e.g., iBeacon, Eddystone, AltBeacon), and the advertising packets comprising the BLE signal may include multiple user configurable fields. These user configurable fields may enable users to include specific values in the advertising packets that may inform any devices receiving the BLE signal in a manner desired by the user. For example, and as discussed herein, the user may configure the advertising packets to include indications corresponding to a battery level of the scanning device 104*a* at the time the BLE signal was transmitted. Moreover, it should be appreciated that any suitable type of beaconing, such as Bluetooth® Classic beaconing, Wi-fi Beaconing, active radio frequency identification (RFID) tags, flashing lights, audible tones, and/or combinations thereof may also be used.

Moreover, unlike conventional techniques, this beaconing between the scanning device 104*a* and other suitable device(s) may continue/occur at any suitable location within the work environment 102. As previously mentioned, conventional techniques suffer from issues stemming from range restrictions to locate scanning devices. In the example scanning environment 100 of FIG. 1, these range restrictions of convention techniques may be represented by the pairing range 106 of the cradle 104*b*. When the scanning device 104*a* is within the pairing range 106 (e.g., at location 108), the cradle 104*b* may page the scanning device 104*a* to locate the device 104*a* and/or may cause the scanning device 104*a* to emit an audible noise and/or visual indications to increase locatability. However, in both instances, the cradle 104*b* has limited ability to reach the scanning device 104*a* beyond the pairing range 106 (e.g., at location 110) and may cause the scanning device 104*a* to perform actions (e.g., emitting an alarm) that substantially reduce the device battery life and correspondingly reduces the likelihood that the scanning device 104*a* is ultimately located if the alarms are not observed.

These issues are resolved using the beaconing between the scanning device 104*a* and any other device(s) (e.g., stationary devices at entry/exit points of the work environment 102, mobile computing devices carried by work environment 102 personnel) within a beaconing range of the scanning device 104*a*. Using beaconing (e.g., BLE beaconing), the scanning device 104*a* may be transported to any suitable location within the work environment 102 outside of the pairing range 106 and the device 104*a* may still be able to communicate by transmitting beacon advertising packets to any suitable proximate device. For example, when the scanning device 104*a* is decoupled from the cradle 104*b* and transported to location 108, the scanning device 104*a* may continue to page the scanning device 104*a* to locate the device 104*a*. However, when the scanning device 104*a* is decoupled from the cradle 104*b* and transported to location 110, the scanning device 104*a* may eventually enter beacon mode and transmit periodic beacon signals to any mobile/stationary device that is configured to receive such periodic beacon signals. Namely, if the scanning device 104*a* is misplaced in location 110, the scanning device 104*a* may detect that the device 104*a* has exceeded the pairing range 106 of the cradle 104*b*, independently adjust its operation by emitting periodic beacon signals when the device battery reaches the beacon SOC threshold, and may thereby preserve battery life and increase the likelihood of being located by devices other than the cradle 104*b*. For example, the scanning device 104*a* utilizing the beaconing systems and methods described herein may continue to transmit beacon signals for weeks (e.g., 2-3 weeks) after the scanning device 104*a* is misplaced.

Namely, and as discussed herein, when the scanning device 104*a* is removed/decoupled from the cradle 104*b* and misplaced/lost in location 108, location 110, and/or any other location within the work environment 102, the scanning device 104*a* may determine whether and when to adjust operations of the scanning device 104*a* to preserve battery life while performing beaconing. The scanning device 104*a* may execute an algorithm to determine a battery percentage threshold or beacon state of charge (SOC), below which, the scanning device 104*a* may transition from a normal operating mode (e.g., configured to capture image data of and/or decode indicia) to a beacon mode. Entering beacon mode may disable certain aspects of the scanning device 104*a* (e.g., decoding functionality), and may result in the scanner emitting beacon signals at a predetermined frequency.

The scanning device 104*a* may determine this beacon SOC based on a user-configurable beacon duration. For example, in the event the scanning device 104*a* is misplaced, a user may desire that the scanning device 104*a* periodically emits beacon signals for at least two weeks to ensure the scanning device 104*a* emits beacon signals for long enough to be reliably located. The scanning device 104*a* may utilize this two-week beacon duration to calculate the beacon SOC, in accordance with the algorithm described herein.

However, in certain embodiments, beaconing may also be enabled at any time based on any suitable user parameter. In these embodiments, if the device battery SOC is above the SOC threshold, then the scanning device 104*a* may emit beacon signals without disabling the scanning/decoding functionality, such that a user may continue to scan/capture image data of indicia while the scanning device 104*a* periodically emits beacon signals. As mentioned, the advertising packets of such beacon signals may include any suitable information, and may be tailored to suit any suitable beaconing protocol.

In some embodiments, the user may configure the beacon mode to not disable scanning/decoding functionalities of the scanning device 104*a* while the device 104*a* remains paired to the cradle 104*b*. Thus, in these embodiments, the device battery SOC of the scanning device 104*a* may cross the SOC threshold while a user is operating the scanning device 104*a* that is paired with the cradle 104*b*. The user may continue to scan/capture image data of indicia while the scanning device 104*a* periodically emits beacon signals, as long as the user continues to operate the scanning device 104*a* within the pairing range 106 of the cradle 104*b*. If the user transports the scanning device 104*a* outside of the pairing range 106 and the device 104*a* becomes unpaired with the cradle 104*b*, the scanning device 104*a* may generate an alert to the user indicating the un-pairing and that the scanning/decoding functionality may be disabled if the scanning device 104*a* does not pair with the cradle 104*b* (or other suitable device) within a time threshold (e.g., 30 seconds, two minutes, five minutes). Additionally, or alternatively, the scanning device 104*a* may detect the user operating the device 104*a* via a most recent trigger pull within a predetermined time threshold, and the scanning device 104*a* may cause the scanning/decoding functionality to be disabled at a lower battery SOC than the calculated beacon SOC to prevent the user from being unable to utilize the scanning/decoding functionality of the scanning device 104*a*.

In any event, the scanning device 104*a* may calculate (1) the expected battery drain during the beacon mode and (2) the beacon mode capacity based on (1) and a user-defined beacon mode duration. The scanning device 104*a* may then calculate a total battery capacity and a nominal battery voltage, and the scanning device 104*a* may compute the total aged battery power and the beacon SOC based on these values and the battery state of health (SOH). As mentioned, this SOC may be a percentage value, below which, the scanning device 104*a* and/or other device(s) may transition from a normal operating mode to the beacon mode.

In certain embodiments, the scanning device 104*a* may include/apply hysteresis effects to the total aged battery power to prevent the scanning device 104*a* from repeatedly entering and exiting beacon mode at battery levels near the beacon SOC. For example, the scanning device 104*a* may impose a constraint to enter beacon mode at a 5% SOC, and may only exit beacon mode when the device battery is charged back up to 10% of the total battery capacity. Further, in certain embodiments, once scanning/decoding functionality is disabled after entering beacon mode, the scanning device 104*a* may only re-enable the scanning/decoding functionality with a successful authentication from a user. In this manner, the scanning device 104*a* may ensure that an authenticated owner/user of the device 104*a* is in possession of the device 104*a* and that the device 104*a* is likely being operated as part of the appropriate overall scanning system.

In any event, the SOH may generally be a weighting value that is applied to the new battery power to account for degradation of the device battery over time. For example, the SOH may account for charging rates, number of recharges, discharge values, and/or other values corresponding to the charging/discharging/recharging of the device battery over time that may degrade the charge carrying capacity of the device battery. In certain embodiments, the device battery of the scanning device 104*a* may be a "smart battery" that may have an internal memory, processors, and/or other suitable components of combinations thereof. The SOH may be internally maintained/monitored by the scanning device 104*a* smart battery and/or the SOH may be calculated by the scanning device 104*a* as part of executing the algorithm.

Additionally, or alternatively, the scanning device 104*a* may determine multiple battery level thresholds that cause the scanning device 104*a* to adjust its operation in the event of being misplaced/lost. For example, in addition to the beacon SOC threshold, the scanning device 104*a* may also calculate a battery critical threshold, at/below which the scanning device 104*a* may deactivate completely. Generally speaking, batteries can be severely damaged (e.g., charge-carrying capacity reduced, recharging capability restricted/eliminated) as a result of a complete discharge. To avoid such damaging effects, the scanning device 104*a* may designate this battery critical threshold to override the beacon mode and completely deactivate the scanning device 104*a*. Practically speaking, the battery critical threshold may represent a remaining device battery charge where there may be little/no usable battery capacity remaining for normal operation or beacon mode operation of the scanning device 104*a*, but that also avoids damaging effects of a complete discharge. As an example, the battery critical threshold may be a value close to and/or otherwise approximately 0% remaining battery life (e.g., 0.1%, 0.01% battery life). The scanning device 104_a_ may continue to emit periodic beacon signals until the device battery reaches approximately 0% remaining battery life, at which point, the scanning device 104_a_ may completely deactivate and cease transmitting beacon signals. In this manner, the scanning device 104_a_ may optimally utilize the remaining battery life during beacon mode without causing a harmful complete discharge of the device battery.

It should be understood that the scanning devices (e.g., scanning device 104_a_) and cradles (e.g., cradle 104_b_) described herein are for the purposes of discussion only. The techniques described herein may be used to simultaneously track any suitable number of scanning devices and/or other suitable devices, and such devices may connect and/or otherwise transmit beacon signals to any suitable number of cradles and/or other suitable devices (e.g., Internet of Things (IoT) bridge).

Figure 2:
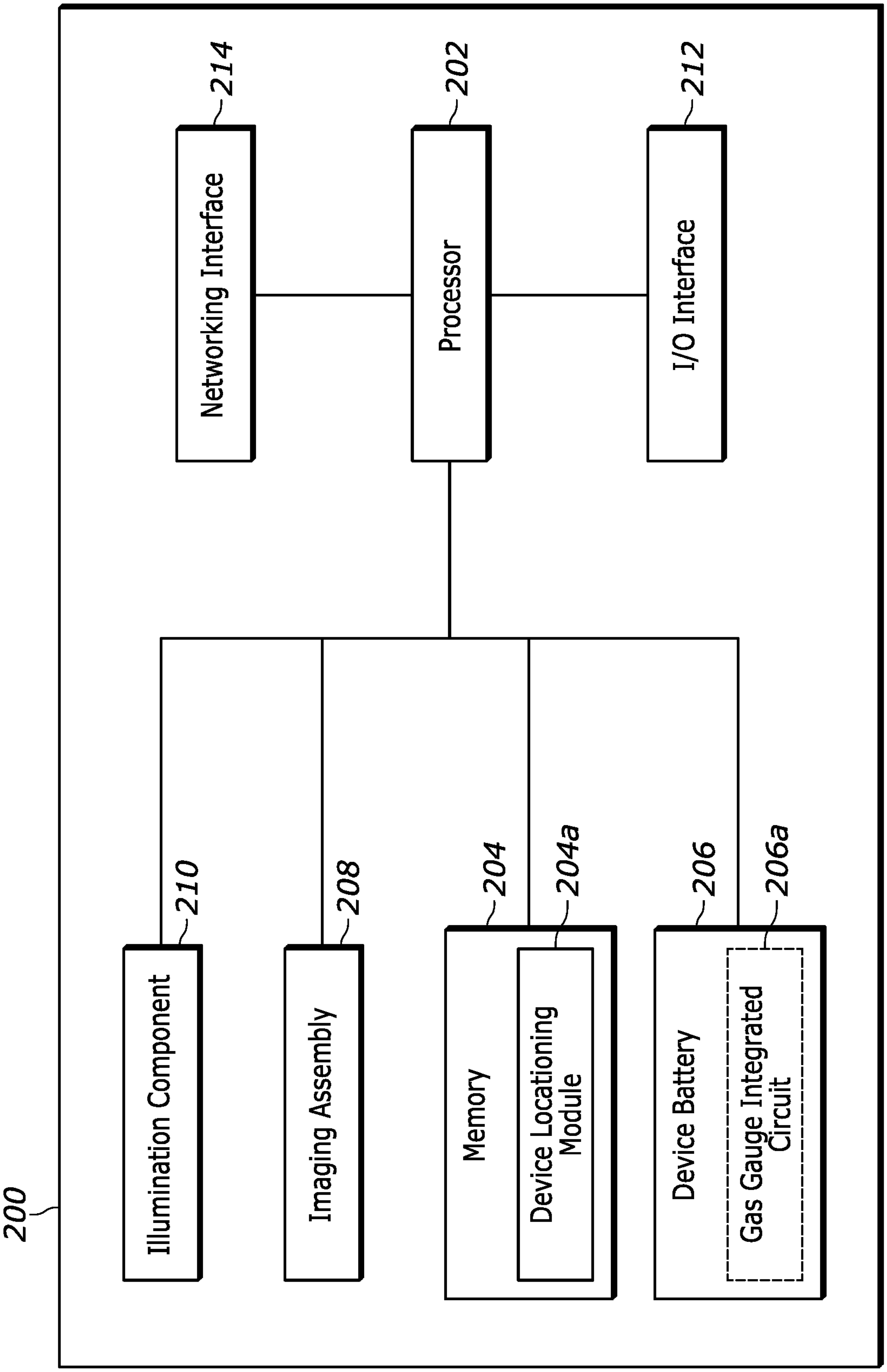
FIG. 2 is a block diagram of an example logic circuit for implementing example methods and/or operations described herein.

FIG. 2 is a block diagram representative of an example logic circuit capable of implementing, for example, one or more components of the scanning device 104_a_ of FIG. 1. The example logic circuit of FIG. 2 is a processing platform 200 capable of executing instructions to, for example, implement operations of the example methods described herein, as may be represented by the flowcharts of the drawings that accompany this description. Other example logic circuits capable of, for example, implementing operations of the example methods described herein include field programmable gate arrays (FPGAs) and application specific integrated circuits (ASICs).

The example processing platform 200 of FIG. 2 includes a processor 202 such as, for example, one or more microprocessors, controllers, and/or any suitable type of processor. The example processing platform 200 of FIG. 2 includes memory (e.g., volatile memory, non-volatile memory) 204 accessible by the processor 202 (e.g., via a memory controller). The example processor 202 interacts with the memory 204 to obtain, for example, machine-readable instructions stored in the memory 204 corresponding to, for example, the operations represented by the flowcharts of this disclosure. The memory 204 also includes a device locationing module 204_a_ that is accessible by the example processor 202.

The device locationing module 204_a_ may comprise or represent rule-based instructions, an artificial intelligence (AI) and/or machine learning-based model(s), and/or any other suitable algorithm architecture or combination thereof configured to, for example, perform device locationing operations for a scanning device (e.g., scanning device 104_a_). To illustrate, the example processor 202 may access the memory 204 to execute the device locationing module 204_a_ and calculate a beacon SOC when the scanning device decouples from a charging cradle (e.g., cradle 104_b_) and a user provides a beacon mode duration. More generally, the device locationing module 204_a_ may include executable instructions configured to calculate the beacon SOC threshold and/or a battery critical threshold and to activate beacon mode (and the corresponding periodic beacon signal transmission) and/or deactivating the scanning device responsive to the device battery SOC crossing the beacon SOC threshold or the battery critical threshold, respectively.

Additionally, or alternatively, machine-readable instructions corresponding to the example operations described herein may be stored on one or more removable media (e.g., a compact disc, a digital versatile disc, removable flash memory, etc.) that may be coupled to the processing platform 200 to provide access to the machine-readable instructions stored thereon.

The example processing platform 200 of FIG. 2 also includes a device battery 206 which may supply power to the scanning device. In certain embodiments, the device battery 206 may be a smart battery with a gas gauge integrated circuit (IC) 206_a_. This gas gauge IC 206_a_ may be configured to calculate, determine, and/or otherwise participate in the determination of a full charge capacity (FCC) and/or an aged total battery power of the device battery 206. For example, the gas gauge IC 206_a_ may maintain and/or store the device battery 206 SOH, and may actively measure the nominal voltage, current, charge, and/or any other suitable value(s) or combinations thereof. Thus, the gas gauge IC 206_a_ may provide the processor 202 these values to calculate the FCC and beacon SOC, and/or may calculate the FCC itself.

The example processing platform 200 of FIG. 2 also includes an imaging assembly 208 and an illumination component 210, which may be collectively configured to capture image data of indicia and/or other objects. In accordance with the systems and methods described herein, the device locationing module 204_a_ may include executable instructions configured to disable one or both of the imaging assembly 208 and/or the illumination component 210 responsive to the device battery SOC crossing the beacon SOC threshold and/or the battery critical threshold. For example, the processors 202 may execute the instructions of the device locationing module 204_a_ and determine that the device battery 206 SOC has crossed the beacon SOC threshold, and the processors 202 may then proceed to deactivate the imaging assembly 208 and/or the illumination component 210, in accordance with further instructions of the device locationing module 204_a_. However, in certain embodiments, the beacon mode may be or include a flashing LED, such that the processor 202 may only disable the imaging assembly 208 in response to the device battery 206 SOC crossing the beacon SOC threshold.

The example processing platform 200 of FIG. 2 also includes a network interface 214 to enable communication with other machines via, for example, one or more networks. The example network interface 214 includes any suitable type of communication interface(s) (e.g., wired and/or wireless interfaces) configured to operate in accordance with any suitable protocol(s) (e.g., BLE, Wi-fi, Ethernet for wired communications and/or IEEE 802.11 for wireless communications). For example, the example processing platform 200 may be communicatively connected with a charging/docking cradle (e.g., cradle 104_b_) through the network interface 214, such that the platform 200 may transmit/receive data to/from the cradle. Additionally, the processors 202 may execute instructions of the device locationing module 204_a_ stored in memory 204 to transmit beacon signals via the networking interface 214 when the scanning device enters beacon mode.

The example processing platform 200 of FIG. 2 also includes input/output (I/O) interfaces 212 to enable receipt of user input and communication of output data to the user. Such user input and communication may include, for example, any number of keyboards, mice, USB drives, optical drives, screens, touchscreens, etc. The I/O interfaces 212 may enable a user to input data, such as a desired beacon mode duration, which the processors 202 may use to calculate the beacon SOC threshold, in accordance with instructions included as part of the device locationing module 204_a_.

Of course, it should be appreciated that, while the various components of the example processing platform 200 (e.g., processors 202, memory 204, etc.) are illustrated in FIG. 2 as single components, the example processing platform 200 may include multiple of each of the components.

Moreover, in certain embodiments, the device locationing module 204*a* may include and/or may otherwise implement machine learning (ML) techniques. Of course, in certain embodiments, any of the models/algorithms implemented as part of the device locationing module 204*a* may be rules-based algorithm(s) configured to receive a beacon mode duration and/or a device battery 206 SOC as an input and to output a beacon SOC threshold and/or other suitable values or combinations thereof.

Generally, ML techniques have been developed that allow parametric or nonparametric statistical analysis of large quantities of data. Such ML techniques may be used to automatically identify relevant variables (e.g., variables having statistical significance or a sufficient degree of explanatory power) from data sets. This may include identifying relevant variables or estimating the effect of such variables that indicate actual observations in the data set. This may also include identifying latent variables not directly observed in the data, viz. variables inferred from the observed data points. More specifically, a processor or a processing element may be trained using supervised or unsupervised ML.

In supervised machine learning, a machine learning program operating on a server, computing device, or otherwise processors, may be provided with example inputs (e.g., "features") and their associated, or observed, outputs (e.g., "labels") for the machine learning program or algorithm to determine or discover rules, relationships, patterns, or otherwise machine learning "models" that map such inputs (e.g., "features") to the outputs (e.g., labels), for example, by determining and/or assigning weights or other metrics to the model across its various feature categories. Such rules, relationships, or otherwise models may then be provided to subsequent inputs for the model, executing on a server, computing device, or otherwise processors as described herein, to predict or classify, based upon the discovered rules, relationships, or model, an expected output, score, or value.

In unsupervised machine learning, the server, computing device, or otherwise processors, may be required to find its own structure in unlabeled example inputs, where, for example multiple training iterations are executed by the server, computing device, or otherwise processors to train multiple generations of models until a satisfactory model, e.g., a model that provides sufficient prediction accuracy when given test level or production level data or inputs, is generated.

Exemplary ML programs/algorithms that may be utilized by the scanning device 104*a* and/or other suitable device(s) to train the models that are included as part of the device locationing module 204*a* may include, without limitation: neural networks (NN) (e.g., convolutional neural networks (CNN), deep learning neural networks (DNN), combined learning module or program), linear regression, logistic regression, decision trees, support vector machines (SVM), naïve Bayes algorithms, k-nearest neighbor (KNN) algorithms, random forest algorithms, gradient boosting algorithms, Bayesian program learning (BPL), voice recognition and synthesis algorithms, image or object recognition, optical character recognition (OCR), natural language understanding (NLU), and/or other ML programs/algorithms either individually or in combination.

After training, ML programs (or information generated by such ML programs) may be used to evaluate additional data. Such data may be and/or may be related to image data and/or other data that was not included in the training dataset. The trained ML programs (or programs utilizing models, parameters, or other data produced through the training process) may accordingly be used for determining, assessing, analyzing, predicting, estimating, evaluating, or otherwise processing new data not included in the training dataset. Such trained ML programs may, therefore, be used to perform part or all of the analytical functions of the methods described elsewhere herein.

It is to be understood that supervised ML and/or unsupervised ML may also comprise retraining, relearning, or otherwise updating models with new, or different, information, which may include information received, ingested, generated, or otherwise used over time. The disclosures herein may use one or more of such supervised and/or unsupervised ML techniques. Further, it should be appreciated that, as previously mentioned, the models that are included as part of the device locationing module 204*a* may be used to output determinations regarding beacon SOC thresholds, battery critical thresholds, beacon/device deactivation/activation signals, using artificial intelligence (e.g., a ML model of the device locationing module 204*a*) or, in alternative aspects, without using artificial intelligence.

Moreover, although the methods described elsewhere herein may not directly mention ML techniques, such methods may be read to include such ML for any determination or processing of data that may be accomplished using such techniques. In some aspects, such ML techniques may be implemented automatically upon occurrence of certain events or upon certain conditions being met. In any event, use of ML techniques, as described herein, may begin with training a ML program, or such techniques may begin with a previously trained ML program.

Figure 3A:
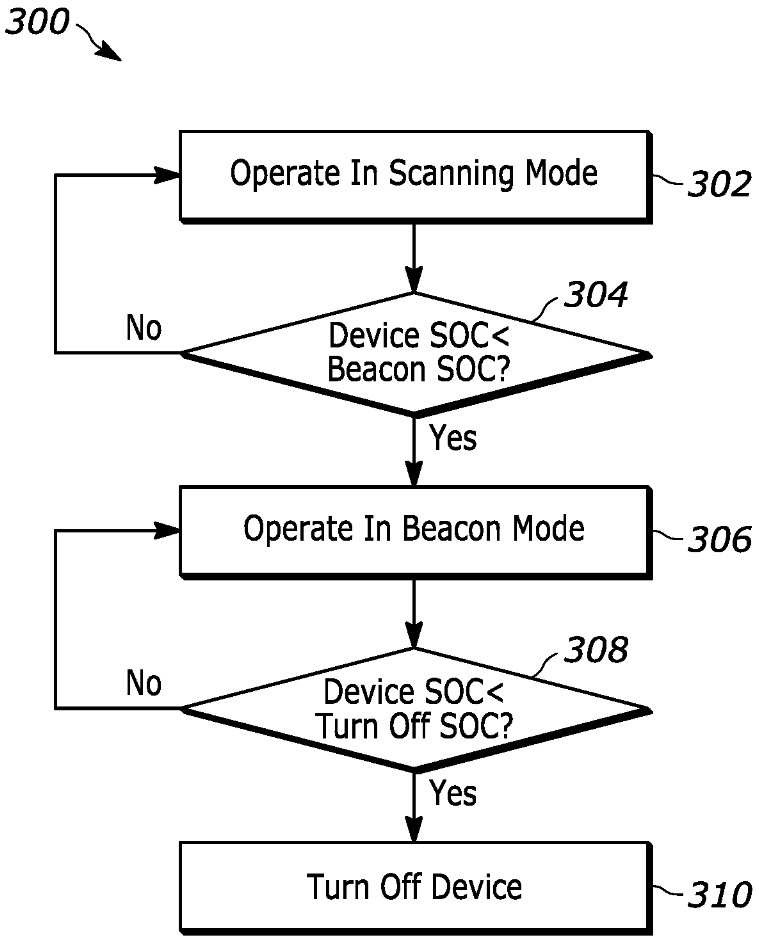
FIGS. 3A-3C are flowcharts representative of various methods for improving device locatability, in accordance with embodiments described herein.

FIG. 3A is a flowchart representative of a method 300 for improving device locatability, in accordance with embodiments described herein. It is to be understood that any of the steps of the method 300 may be performed by, for example, the scanning device 104*a*, the cradle 104*b*, and/or any other suitable components, components contained therein, and/or combinations thereof discussed herein.

At block 302, the method 300 includes a scanning device (e.g., scanning device 104*a*) operating in scanning mode. Scanning mode may generally represent the scanning device operating normally, such as with the imaging assembly (e.g., imaging assembly 208) and illumination components (e.g., illumination component 210) activating in response to a trigger pull and/or other activation signal for the scanning device to capture image data of indicia and/or other objects. During operation in scanning mode and/or at any other suitable time, the scanning device may determine the beacon SOC.

In particular, the scanning device may receive the user-configured beacon mode duration, and may calculate the beacon SOC threshold based on this duration and several parameters of the device battery, such as a beacon mode capacity (BC) and a full charge capacity (FCC). The scanning device may measure/determine the device battery voltage and current the device battery uses during beacon mode, and may compute the average power consumption (e.g., in milliwatts (mW)) of the scanning device during the beacon mode by multiplying the voltage and current values during beacon mode. The scanning device may combine this average power consumption with the beacon mode duration to determine the BC (e.g., in milliwatt hours (mWh)).

The scanning device may also proceed to determine the FCC of the device battery by determining the total battery capacity (e.g., in milliamp hours (mAh)) of the device battery, as stored in memory (e.g., memory 204) and/or by a smart device battery, the nominal battery voltage (e.g., in volts (V)), and calculate the total battery power (e.g., in mWh) of the device battery when new by multiplying the total battery capacity with the nominal battery voltage. The scanning device may then determine an aged total battery power of the device battery by multiplying the total battery power by the battery-state-of-health (SOH), as retrieved from memory and/or by the smart device battery. In certain embodiments, the aged battery power may be the FCC, but in other embodiments, the scanning device may apply a hysteresis value to the aged total battery power to determine the FCC. Regardless, the scanning device may calculate the beacon SOC threshold by dividing the BC by the FCC and multiplying by 100. In this manner, the scanning device may determine an accurate beacon SOC threshold in response to the user's input beacon mode duration that enables the scanning device to reliably transmit beacon signals throughout the user's desired duration if/when the scanning device is misplaced/lost.

For example, the user of a scanning device may input a beacon mode duration of two weeks (336 hours), and the device battery SOH may be 85%, such that the device battery has a total capacity that is 85% of the total capacity when the device battery was new. The scanning device may also have a battery capacity of 2500 mAh, a nominal voltage of 3.8 V, and beacon mode power consumption of 4 mW. Accordingly, the scanning device may compute the BC based on the beacon mode duration and the beacon mode power, as discussed above, and the device may determine that the BC is approximately 1334 mWh (e.g., 336 hours*4 mW=1344 mWh). The scanning device may also compute the FCC based on the SOH, the battery capacity, and the nominal voltage to determine that the FCC is approximately 8075 mWh (e.g., 2500 mAh*3.8 V*0.85=8075 mWh). Accordingly, the scanning device may determine that the beacon SOC threshold is approximately 17% (e.g., $$\frac{1344\ \text{mWh}}{8075\ \text{mWh}} \cong 17\%),$$

such that the device battery may transition to beacon mode when the device SOC drops below 17% of the maximum charge capacity.

Thus, at block 304, the method 300 may further include checking whether the device SOC has dropped below the beacon SOC threshold. If the device SOC is not below the beacon SOC threshold (No branch of block 304), then the method 300 may return to block 302, where the scanning device may continue to operate in scanning mode. However, if the device SOC is below the beacon SOC threshold (Yes branch of block 304), then the method 300 may proceed to block 306. At block 306, the method 300 includes the scanning device transitioning from scanning mode to beacon mode. As previously mentioned, the scanning device may enter beacon mode by deactivating certain functionality (e.g., indicia scanning/decoding) and/or components (e.g., the imaging assembly 208 and/or the illumination component 210) that was active during scanning mode to preserve remaining device battery life. Additionally, entering beacon mode may initiate the periodic beaconing described herein.

While the scanning device is operating in beacon mode, the method 300 may further include checking whether the device SOC drops below the turn off SOC (e.g., the battery critical threshold) (block 308). If the device SOC is greater than the battery critical threshold (No branch of block 308), then the method 300 may return to block 306, where the scanning device may continue operating in beacon mode. However, if the device SOC is less than the battery critical threshold (Yes branch of block 308), then the method 300 may proceed to block 310, where the scanning device may be completely deactivated to prevent a complete discharge of the device battery.

Figure 3B:
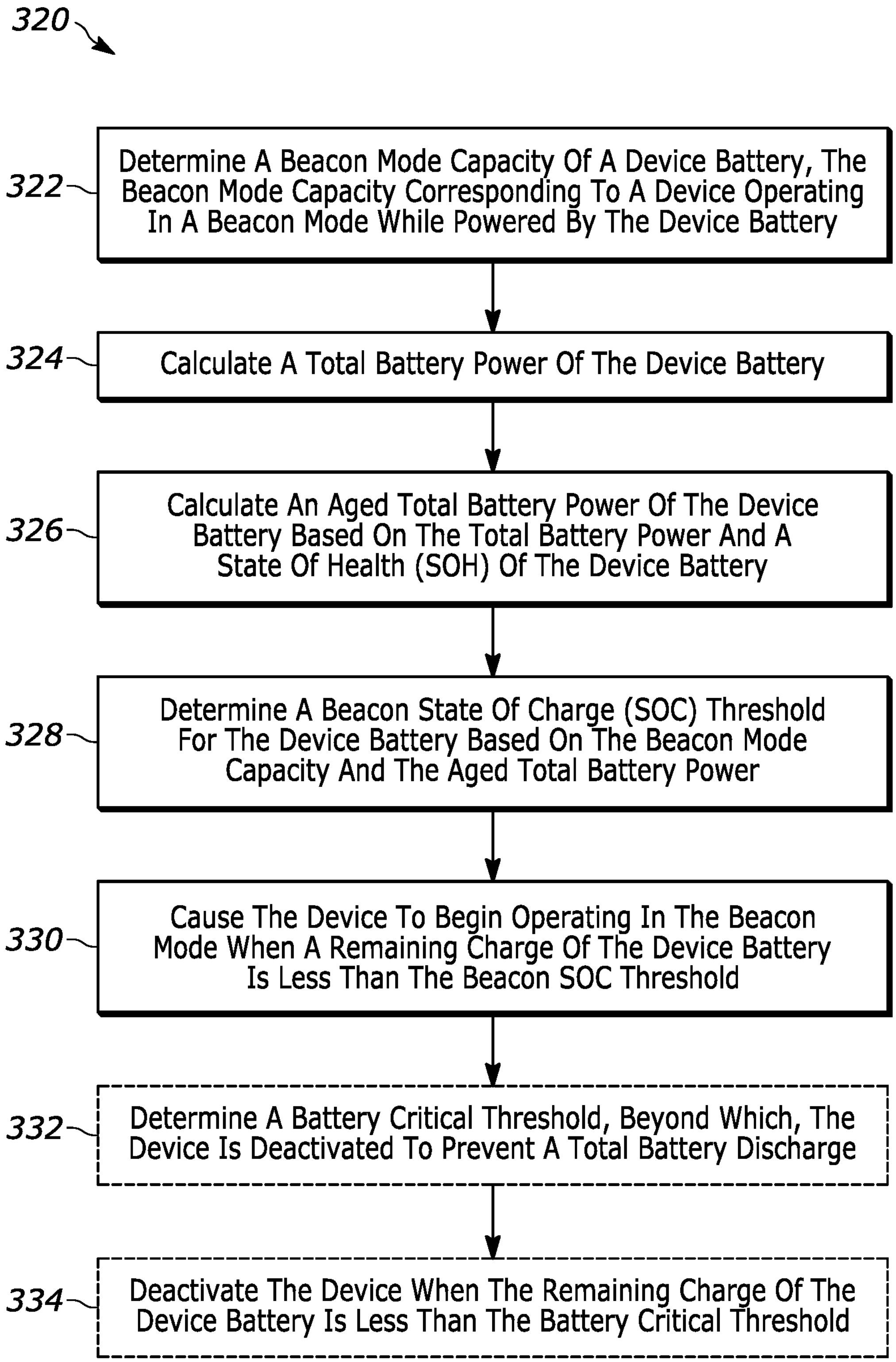

FIG. 3B is a flowchart representative of a method 320 for improving device locatability, in accordance with embodiments described herein. It is to be understood that any of the steps of the method 320 may be performed by, for example, the scanning device 104*a*, the cradle 104*b*, and/or any other suitable components, components contained therein, and/or combinations thereof discussed herein.

At block 322, the method 320 includes determining a beacon mode capacity of a device battery, the beacon mode capacity corresponding to a scanning device operating in a beacon mode while powered by the device battery. The method 320 may further include calculating a total battery power of the device battery (block 324). The method 320 may further include calculating an aged total battery power of the device battery based on the total battery power and a SOH of the device battery (block 326). The method 320 may further include determining a beacon SOC threshold for the device battery based on the beacon mode capacity and the aged total battery power (block 328). The method 320 may further include causing the scanning device to begin operating in the beacon mode when a remaining charge of the device battery is less than the beacon SOC threshold (block 330).

Optionally, the method 320 may further include determining a battery critical threshold, beyond which, the scanning device is deactivated to prevent a total battery discharge (block 332). Further, in certain embodiments, the method 320 may include deactivating the scanning device when the remaining charge of the device battery is less than the battery critical threshold (block 334).

In some embodiments, the beacon mode capacity of the device battery may be determined based on a user-defined beacon mode duration, during which, the device battery may be configured to power the scanning device to operate in the beacon mode. In these embodiments, the method 320 may further include: determining a battery voltage and a battery current of the device battery when the scanning device operates in the beacon mode; calculating, based on the battery voltage and the battery current, an average power consumption of the device battery when the scanning device operates in the beacon mode; and determining the beacon mode capacity of the device battery based on the average power consumption and the user-defined beacon mode duration.

In certain embodiments, the method 320 may further include: determining a full charge capacity (FCC) of the device battery based on the aged total battery power; and determining the beacon SOC threshold based on the beacon mode capacity and the FCC. Further in this variation, the device battery may be a smart battery, and the FCC may be determined based on a gas gauge IC (e.g., gas gauge IC 206*a*) of the smart battery.

In some embodiments, the scanning device may be an imaging device including an illumination component and an imaging assembly, and wherein causing the scanning device to begin operating in the beacon mode may further include: disabling the illumination component and the imaging assembly; and periodically emitting a beacon signal. Further in these embodiments, the beacon signal may include one or more of: (i) an advertising packet in Bluetooth Low Energy (BLE) beaconing, (ii) an advertising packet in Bluetooth Classic beaconing, (iii) an advertising packet in Wi-Fi beaconing, (iv) a flash from an illumination device, (v) an audible tone, (vi) a radio frequency identification (RFID) signal, and/or any other radio frequency signaling/communication method or combinations thereof.

In certain embodiments, the scanning device may be configured to pair with a host device (e.g., cradle 104*b*) when the scanning device is within a pairing range of the host device. In these embodiments, the method 320 may further include: determining that the scanning device has exceeded the pairing range of the host device; and causing the scanning device to begin operating in the beacon mode when the remaining charge of the device battery reaches the beacon SOC threshold and while the scanning device continues to exceed the pairing range of the host device. Further in these embodiments, the beacon SOC threshold may be a first beacon SOC threshold, and the method 320 may further include: determining that the scanning device is within the pairing range of the host device; and causing the scanning device to begin operating in the beacon mode when the remaining charge of the device battery reaches a second beacon SOC threshold and while the scanning device remains within the pairing range of the host device, wherein the second beacon SOC threshold is less than the first beacon SOC threshold.

In some embodiments, the total battery power of the device battery may represent the scanning device battery having a maximum battery capacity at a nominal battery voltage and a maximum SOH.

Figure 3C:
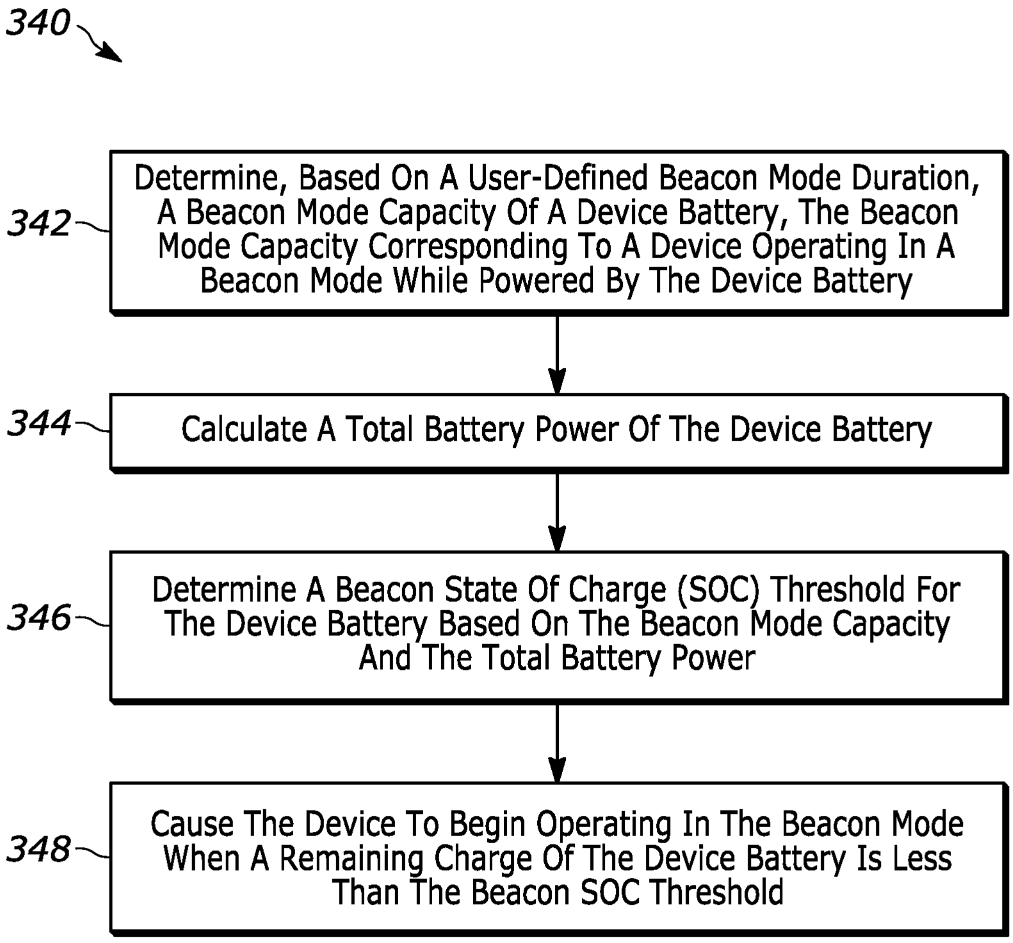

FIG. 3C is a flowchart representative of a method 340 for improving device locatability, in accordance with embodiments described herein. It is to be understood that any of the steps of the method 340 may be performed by, for example, the scanning device 104*a*, the cradle 104*b*, and/or any other suitable components, components contained therein, and/or combinations thereof discussed herein.

At block 342, the method 340 includes determining, based on a user-defined beacon mode duration, a beacon mode capacity of a device battery, the beacon mode capacity corresponding to a scanning device operating in a beacon mode while powered by the device battery. The method 340 may further include calculating a total battery power of the device battery (block 344) and determining a beacon SOC threshold for the device battery based on the beacon mode capacity and the total battery power (block 346). The method 340 may further include causing the scanning device to begin operating in the beacon mode when a remaining charge of the device battery is less than the beacon SOC threshold (block 348).

In some embodiments, the method 340 may further include: calculating an aged total battery power of the device battery based on the total battery power and a state of health (SOH) of the device battery; and determining the beacon SOC threshold for the device battery based on the beacon mode capacity and the aged total battery power.

In certain embodiments, the method 340 may further include: determining a battery voltage and a battery current of the device battery when the scanning device operates in the beacon mode; calculating, based on the battery voltage and the battery current, an average power consumption of the device battery when the scanning device operates in the beacon mode; and determining the beacon mode capacity of the device battery based on the average power consumption and the user-defined beacon mode duration.

In some embodiments, the method 340 may further include: determining a full charge capacity (FCC) of the device battery based on the aged total battery power; and determining the beacon SOC threshold based on the beacon mode capacity and the FCC. Further in these embodiments, the device battery may be a smart battery, and the FCC may be determined based on a gas gauge IC (e.g., gas gauge IC 206*a*) of the smart battery.

In certain embodiments, the scanning device may be an imaging device including an illumination component and an imaging assembly, and causing the scanning device to begin operating in the beacon mode may further include: disabling the illumination component and the imaging assembly; and periodically emitting a beacon signal.

In some embodiments, the scanning device may be configured to pair with a host device when the scanning device is within a pairing range of the host device, and the method 340 may further include: determining that the scanning device has exceeded the pairing range of the host device; and causing the scanning device to begin operating in the beacon mode when the remaining charge of the device battery reaches the beacon SOC threshold and while the scanning device continues to exceed the pairing range of the host device.

In certain embodiments, the method 340 may further include: determining a battery critical threshold, beyond which, the scanning device is deactivated to prevent a total battery discharge; and deactivating the scanning device when the remaining charge of the device battery is less than the battery critical threshold.

Of course, it is to be appreciated that the actions of any of the methods 300, 320, 340 may be performed any suitable number of times, and that the actions described in reference to any of the methods 300, 320, 340 may be performed any suitable number of times and in any suitable order.

Additional Considerations

The above description refers to a block diagram of the accompanying drawings. Alternative implementations of the example represented by the block diagram includes one or more additional or alternative elements, processes and/or devices. Additionally, or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components represented by the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions. The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may combined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A computer-implemented method for improving device locatability, the method comprising:

determining a beacon mode capacity of a device battery, the beacon mode capacity corresponding to a device operating in a beacon mode while powered by the device battery;

calculating a total battery power of the device battery;

calculating an aged total battery power of the device battery based on the total battery power and a state of health (SOH) of the device battery;

determining a beacon state of charge (SOC) threshold for the device battery based on the beacon mode capacity and the aged total battery power; and causing the device to begin operating in the beacon mode when a remaining charge of the device battery is less than the beacon SOC threshold.

2. The computer-implemented method of claim 1, wherein the beacon mode capacity of the device battery is determined based on a user-defined beacon mode duration, during which, the device battery is configured to power the device to operate in the beacon mode.

3. The computer-implemented method of claim 2, further comprising:

determining a battery voltage and a battery current of the device battery when the device operates in the beacon mode;

calculating, based on the battery voltage and the battery current, an average power consumption of the device battery when the device operates in the beacon mode; and determining the beacon mode capacity of the device battery based on the average power consumption and the user-defined beacon mode duration.

4. The computer-implemented method of claim 1, further comprising:

determining a full charge capacity (FCC) of the device battery based on the aged total battery power; and determining the beacon SOC threshold based on the beacon mode capacity and the FCC.

5. The computer-implemented method of claim 4, wherein the device battery is a smart battery, and the FCC is determined based on a gas gauge integrated circuit (IC) of the smart battery.

6. The computer-implemented method of claim 1, wherein the device is an imaging device including an illumination component and an imaging assembly, and wherein causing the device to begin operating in the beacon mode further comprises:

disabling the illumination component and the imaging assembly; and periodically emitting a beacon signal.

7. The computer-implemented method of claim 6, wherein the beacon signal includes one or more of: (i) an advertising packet in Bluetooth Low Energy (BLE) beaconing, (ii) an advertising packet in Bluetooth Classic beaconing, (iii) an advertising packet in Wi-Fi beaconing, (iv) a flash from an illumination device, (v) an audible tone, or (vi) a radio frequency identification (RFID) signal.

8. The computer-implemented method of claim 1, wherein the device is configured to pair with a host device when the device is within a pairing range of the host device, and the method further comprises:

determining that the device has exceeded the pairing range of the host device; and causing the device to begin operating in the beacon mode when the remaining charge of the device battery reaches the beacon SOC threshold and while the device continues to exceed the pairing range of the host device.

9. The computer-implemented method of claim 8, wherein the beacon SOC threshold is a first beacon SOC threshold, and the method further comprises:

determining that the device is within the pairing range of the host device; and causing the device to begin operating in the beacon mode when the remaining charge of the device battery reaches a second beacon SOC threshold and while the device remains within the pairing range of the host device, wherein the second beacon SOC threshold is less than the first beacon SOC threshold.

10. The computer-implemented method of claim 1, further comprising:

determining a battery critical threshold, beyond which, the device is deactivated to prevent a total battery discharge; and deactivating the device when the remaining charge of the device battery is less than the battery critical threshold.

11. The computer-implemented method of claim 1, wherein the total battery power of the device battery represents the device battery having a maximum battery capacity at a nominal battery voltage and a maximum SOH.

12. A computer-implemented method for improving device locatability, the method comprising:

determining, based on a user-defined beacon mode duration, a beacon mode capacity of a device battery, the beacon mode capacity corresponding to a device operating in a beacon mode while powered by the device battery;

calculating a total battery power of the device battery;

determining a beacon state of charge (SOC) threshold for the device battery based on the beacon mode capacity and the total battery power; and causing the device to begin operating in the beacon mode when a remaining charge of the device battery is less than the beacon SOC threshold.

13. The computer-implemented method of claim 12, further comprising:

calculating an aged total battery power of the device battery based on the total battery power and a state of health (SOH) of the device battery; and determining the beacon SOC threshold for the device battery based on the beacon mode capacity and the aged total battery power.

14. The computer-implemented method of claim 12, further comprising:

determining a battery voltage and a battery current of the device battery when the device operates in the beacon mode;

calculating, based on the battery voltage and the battery current, an average power consumption of the device battery when the device operates in the beacon mode; and determining the beacon mode capacity of the device battery based on the average power consumption and the user-defined beacon mode duration.

15. The computer-implemented method of claim 12, further comprising:

determining a full charge capacity (FCC) of the device battery based on the aged total battery power; and determining the beacon SOC threshold based on the beacon mode capacity and the FCC.

16. The computer-implemented method of claim 15, wherein the device battery is a smart battery, and the FCC is determined based on a gas gauge integrated circuit (IC) of the smart battery.

17. The computer-implemented method of claim 12, wherein the device is an imaging device including an illumination component and an imaging assembly, and wherein causing the device to begin operating in the beacon mode further comprises:

disabling the illumination component and the imaging assembly; and periodically emitting a beacon signal.

18. The computer-implemented method of claim 12, wherein the device is configured to pair with a host device when the device is within a pairing range of the host device, and the method further comprises:

determining that the device has exceeded the pairing range of the host device; and causing the device to begin operating in the beacon mode when the remaining charge of the device battery reaches the beacon SOC threshold and while the device continues to exceed the pairing range of the host device.

19. The computer-implemented method of claim 12, further comprising:

determining a battery critical threshold, beyond which, the device is deactivated to prevent a total battery discharge; and deactivating the device when the remaining charge of the device battery is less than the battery critical threshold.

20. A tangible machine-readable medium comprising instructions for improving device locatability that, when executed, cause a machine to at least:

determine a beacon mode capacity of a device battery, the beacon mode capacity corresponding to a device operating in a beacon mode while powered by the device battery;

calculate a total battery power of the device battery;

calculate an aged total battery power of the device battery based on the total battery power and a state of health (SOH) of the device battery;

determine a beacon state of charge (SOC) threshold for the device battery based on the beacon mode capacity and the aged total battery power; and cause the device to begin operating in the beacon mode when a remaining charge of the device battery is less than the beacon SOC threshold.

21. A device for improving device locatability, the device comprising:

one or more processors; and a memory configured to store instructions thereon, that when executed by the one or more processors, cause the one or more processors to:

determine a beacon mode capacity of a device battery, the beacon mode capacity corresponding to the device operating in a beacon mode while powered by the device battery, calculate a total battery power of the device battery, calculate an aged total battery power of the device battery based on the total battery power and a state of health (SOH) of the device battery, determine a beacon state of charge (SOC) threshold for the device battery based on the beacon mode capacity and the aged total battery power, and cause the device to begin operating in the beacon mode when a remaining charge of the device battery is less than the beacon SOC threshold.

22. A device for improving device locatability, the device comprising:

one or more processors; and a memory configured to store instructions thereon, that when executed by the one or more processors, cause the one or more processors to:

determine, based on a user-defined beacon mode duration, a beacon mode capacity of a device battery, the beacon mode capacity corresponding to the device operating in a beacon mode while powered by the device battery, calculate a total battery power of the device battery, determine a beacon state of charge (SOC) threshold for the device battery based on the beacon mode capacity and the total battery power, and cause the device to begin operating in the beacon mode when a remaining charge of the device battery is less than the beacon SOC threshold.

* * * * *